United States Patent [19]
Eifuku et al.

[11] Patent Number: 5,962,925
[45] Date of Patent: Oct. 5, 1999

[54] MOUNTING STRUCTURE OF ELECTRONIC COMPONENT HAVING BUMPS

[75] Inventors: Hideki Eifuku, Omuta; Tadahiko Sakai, Fukuoka, both of Japan

[73] Assignee: Matsushita Electric Industrial Co., Ltd., Japan

[21] Appl. No.: 09/189,296

[22] Filed: Nov. 10, 1998

[30] Foreign Application Priority Data

Nov. 10, 1997 [JP] Japan .................................... 9-306861

[51] Int. Cl.$^6$ .................................................. H01L 23/48
[52] U.S. Cl. ........................ 257/778; 257/738; 257/747; 257/780; 361/742; 438/108
[58] Field of Search ..................... 257/778, 738, 257/737, 747, 780, 781; 361/742; 438/108

[56] References Cited

U.S. PATENT DOCUMENTS 4,970,575  11/1990  Soga et al. ............................. 257/786
5,863,815  1/1999  Egawa ..................................... 438/118

FOREIGN PATENT DOCUMENTS 401143346  6/1989  Japan .
405243330  9/1993  Japan .

*Primary Examiner*—Tom Thomas
*Assistant Examiner*—Luan Thai
*Attorney, Agent, or Firm*—Rossi & Associates

[57] ABSTRACT

The mounting structure of an electronic component having bumps includes a multi-layer substrate provided with an outermost layer substrate having electrode on the top thereof and a lower layer substrate comprising at least one layer substrate joining the bottom of the outermost layer substrate, an electronic component having bumps bonded with the electrodes formed on the top of the outermost layer substrate for connecting the electronic component and the substrate, and under-fill resin formed between the electronic component and the outermost layer substrate, in which the coefficient of linear thermal expansion of the under-fill resin is larger than that of the electronic component, but smaller than that of the outermost layer substrate.

7 Claims, 7 Drawing Sheets

5,962,925

MOUNTING STRUCTURE OF ELECTRONIC COMPONENT HAVING BUMPS

FIELD OF THE INVENTION

The present invention relates to a mounting structure of an electronic component having bumps, and more particularly to the mounting structure obtained by mounting the electronic component having bumps on a substrate.

BACKGROUND OF THE INVENTION

An electronic component such as flip chip having bumps is mounted by bonding the bumps, which protrude from the body of the electronic component, with electrodes formed on a substrate. The substrate on which the electronic component is mounted suffers, depending on the application, from heating cycles, namely, repeated large changes of temperature. In general, the electronic component having bumps is an IC chip whose base material is a silicon single crystal. On the other hand, for the substrate on which the electronic component is mounted, resin or ceramic is generally utilized. Since there is large difference of the coefficient of linear thermal expansion between the silicon single crystal and the resin or the ceramic, when the mounted component is used under condition of large change of temperature, repeated stress acts on the bonded portions of the bumps of the electronic component and the electrodes of the substrate or on the bonded portions of the electronic component and the bumps, which may result in the breaking of the bonded portions.

In the following, an explanation on a conventional mounting structure of an electronic component having bumps is described referring to illustrations. FIG. 5 is a cross sectional view showing the conventional mounting structure of an electronic component having bumps. In FIG. 5, electrodes 2 formed on a substrate 1 are bonded with the bumps 4 of an electronic component 3 by soldering. Between the substrate 1 and the electronic component 3, under-fill resin 5 is formed. The under-fill resin 5 is for protecting the bonded portions of bumps 4 and electrodes 2 from water or the like and for decreasing the stress caused by the heat cycle described above.

From the standpoint of decreasing the stress, the coefficient of linear thermal expansion of the under-fill resin 5 formed between the electronic component 3 and the substrate 1 is desired to be an intermediate value between those of the electronic component and the substrate. However, the coefficient of linear thermal expansion of epoxy resin used in general for under-fill resin is much larger than those of a silicon single crystal used for the electronic component 3 and ceramic used for the substrate 1. At present, no resin is available, in actual use, for under-fill resin which meets the above-described condition.

Therefore, in the conventional mounting structure of the electronic component having bumps, the under-fill resin does not work effectively for decreasing the stress caused by the heat cycles, so that there is a problem that the reliability of the mounting structure is not satisfactory.

SUMMARY OF THE INVENTION

The present invention aims to provide a reliable mounting structure of an electronic component having bumps, namely the mounting structure which decreases the thermal stress caused by heat cycle, whereby the reliability of the mounting structure is improved.

The mounting structure of the electronic component having bumps of the present invention comprises a multi-layer substrate provided with an outermost layer substrate having electrodes on the top of the substrate and a lower layer substrate comprising at least one substrate joining the bottom of the outermost layer substrate, the electronic component having bumps which are bonded with the electrodes formed on the top of the outermost layer substrate for connecting the electronic component and the substrate, and under-fill resin formed between the electronic component and the top of the uppermost layer substrate, in which the coefficient of linear thermal expansion of the under-fill resin is larger than that of the electronic component, but smaller than that of the outermost layer substrate.

Namely, in the present invention, the coefficient of linear thermal expansion of the under-fill resin is set at an intermediate value between those of the electronic component and the substrate, so that the stress caused by the difference of the coefficient of thermal expansion is effectively decreased, whereby the reliability of the mounting structure is improved.

DESCRIPTION OF PREFERED EMBODIMENTS

First Exemplary Embodiment

In the following, an explanation on a mounting structure of an electronic component having bumps in a first exemplary embodiment of the present invention is described referring to illustrations.

Figure 1:
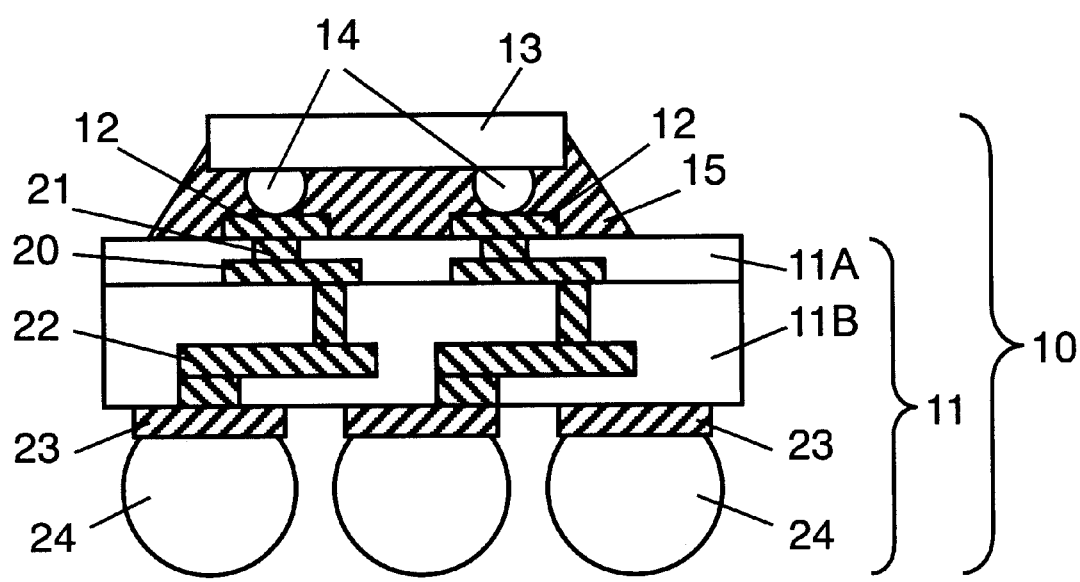
FIG. 1 is a cross sectional view showing the mounting structure of an electronic component having bumps, in a first exemplary embodiment of the present invention.

In FIG. 1, a multi-layer substrate 11 comprises an upper layer (outermost layer) substrate 11A and a lower layer substrate 11B. The lower layer substrate is not limited to be formed with one layer, but can be formed with two or more layers. The outermost layer substrate 11A is formed with epoxy resin containing 0–5 wt. % silica filler for instance. The lower layer substrate 11B is formed with alumina for instance. On the top of the outermost layer substrate 11A, outermost layer electrodes 12 are formed. The outermost electrodes 12 are bonded with bumps 14 of an electronic component 13 by soldering or by sticking with adhesive for mounting the electronic component 13 on the outermost layer substrate 11A. Into the space between the electronic component 13 and the outermost layer 11A, epoxy resin is injected for forming under-fill resin 15. The main ingredient of the under-fill resin 15 is epoxy resin containing 50 wt. % silica filler for instance. The under-fill resin 15 is for sealing the bonded portions of the bumps 14 and the outermost electrodes 12, and for decreasing the repeated stress caused by heat cycles.

The following is an explanation on the inner structure of the multi-layer substrate 11. On the top of the lower layer substrate 11B, inner electrodes 20 are formed. The inner electrodes 20 are connected with the outermost layer electrodes 12 formed on the top of the outermost layer substrate 11A by inner circuits 21 formed inside the outermost layer substrate 11A. Inside the lower layer substrate 11B, inner circuits 22 are formed. The inner circuits 22 connect the inner electrodes 20 and bottom electrodes 23 formed at the bottom of the lower layer substrate 11B. At the bottom electrodes 23, bumps 24 are formed. The electronic component 13 having bumps is further mounted, through the multi-layer substrate 11, on other substrate or the like (not illustrated) with the bumps 24.

The following is an explanation on the coefficients of linear thermal expansion, by heat, of the material of portions forming the above-described mounting structure. The materials and coefficients α of the linear thermal expansion of the electronic component 13 having bumps, the under-fill resin 15, the outermost layer substrate 11A and the lower layer substrate 11B are tabulated in Table 1. From Table 1, it is understood that the coefficient α of linear thermal expansion a of the under-fill resin 15 is an intermediate value between those of the electronic component 13 and the outermost layer substrate 11A. Namely the bonded portions of the bumps 14 and the outermost layer electrodes 12 are sealed by the under-fill resin 15 having the intermediate coefficient of linear thermal expansion between those of the electronic component 13 and the outermost layer substrate 11A. Accordingly, the repeated stress, caused by the heat cycles, at the bonded portions of the bumps 14 and the outermost layer electrodes 12, is effectively decreased by the under-fill resin 15, whereby the breaking of the bonded portions caused by the repeated stress is prevented.

TABLE 1

| Portion | Material | α(/k) |
| --- | --- | --- |
| Electronic component 13 having bumps | Silicon single crystal | $3 \times 10^{-6}$ |
| Under-fill resin 15 | Epoxy resin (Silica filler: 50 wt. %) | $30 \times 10^{-6}$ |
| Outermost layer substrate 11A | Epoxy resin (Silica filler: 0–5 wt. %) | $60 \times 10^{-6}$ |
| Lower layer substrate 11B | Alumina | $8 \times 10^{-6}$ |

Not only alumina but also fiber-glass reinforced epoxy resin FR4 having coefficient of linear thermal expansion $18 \times 10^{-6}$ (/k) and fiber-glass reinforced epoxy resin CEM3 having coefficient of linear thermal expansion $18 \times 10^{-6}$ (/k) etc are applicable for the material of the lower layer substrate 11B. When material having a large coefficient of linear thermal expansion is used for the outermost layer substrate 11A, the coefficient of linear thermal expansion of outermost layer substrate 11A differs much from that of the lower layer substrate 11B. However, since the two substrates are solidly fixed all over the joining sides, a defect such as a break between these does not occur by the repeated stress caused by the heat cycles.

The following is an explanation on a mounting method of the electronic component having bumps in the first exemplary embodiment of the present invention, in which FIG. 2A through FIG. 2H are referred to.

Figure 2A:
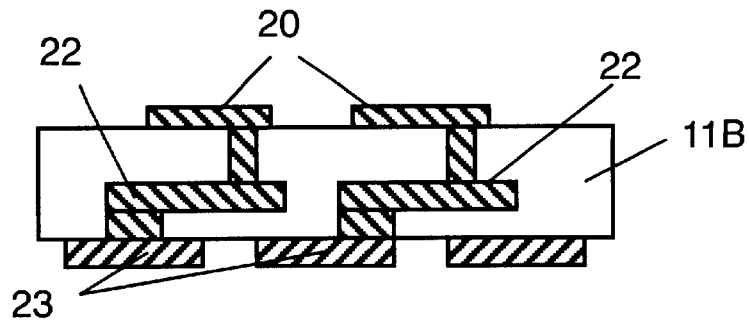
FIG. 2A through FIG. 2H are cross sectional process views showing the mounting method of the electronic component having bumps, in the first exemplary embodiment of the present invention.

Firstly, as shown in FIG. 2A, on the top and the bottom of the lower layer substrate 11B, the inner electrodes 20 and the bottom electrodes 23 are respectively formed, then the inner electrodes 20 and the bottom electrodes 23 are connected by the inner circuits 22 formed inside the lower layer substrate 11B.

Figure 2B:
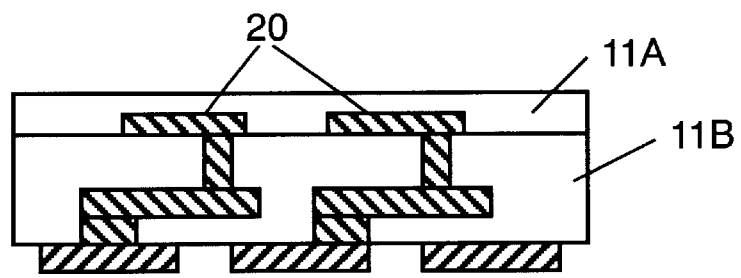

Then, as shown in FIG. 2B, on the lower layer substrate 11B, the outermost layer substrate 11A is formed by sticking a film made of epoxy resin or by applying liquid epoxy resin, accordingly the lower layer substrates 11B and the outermost layer substrate 11A are solidly fixed all over the joining sides.

Figure 2C:
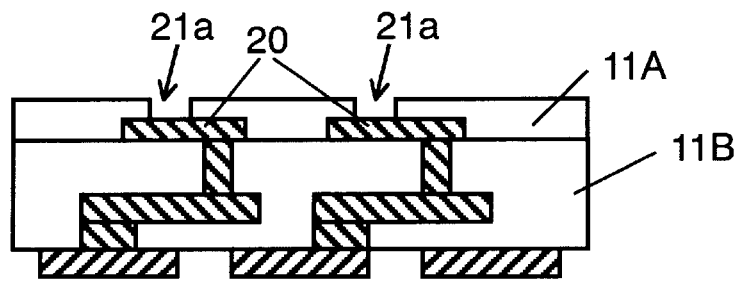
Figure 2D:
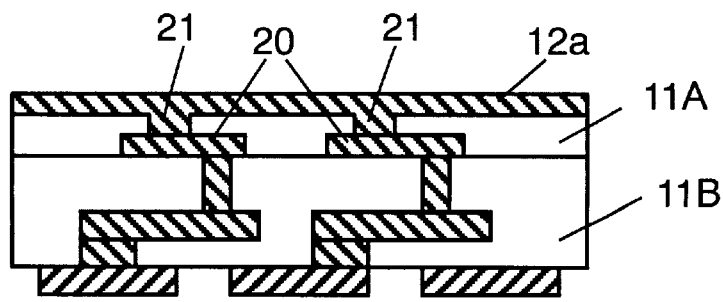

Then, as shown in FIG. 2C, at the positions of the inner electrodes 20 of the outermost layer substrate 11A, openings 21a are formed. After that, as shown in FIG. 2D, on the top of the outermost layer substrate 11A, plated layer 12a is formed with metal such as copper.

Figure 2E:
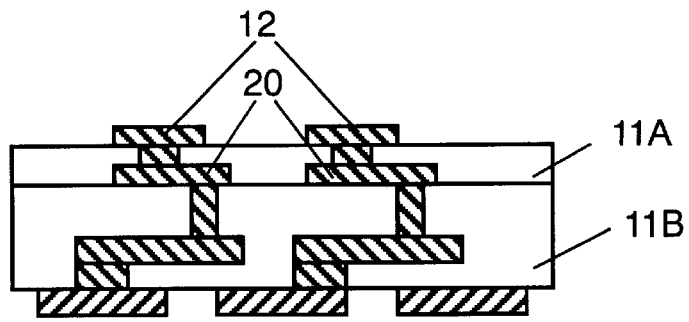

Then, as shown in FIG. 2E, by selectively etching the plated layer 12a, the outermost layer electrodes 12 are formed on the top of the outermost layer substrate 11A.

Figure 2F:
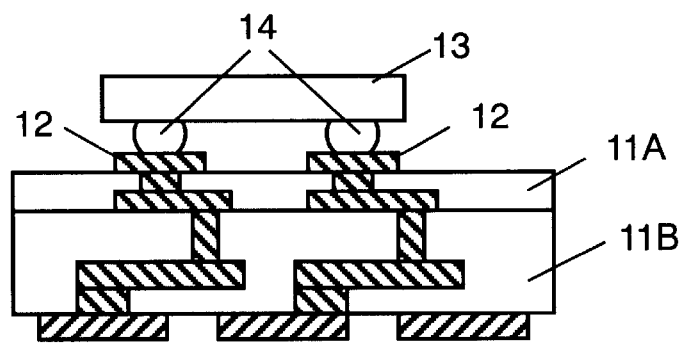
Figure 2G:
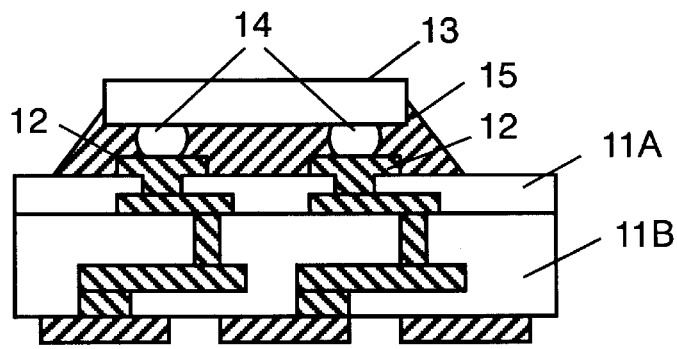

Then, as shown in FIG. 2F, the electronic component 13 having bumps is mounted on the outermost layer substrate 11A, and the bumps 14 of the electronic component 13 are bonded with the outermost layer electrodes 12 by soldering or by sticking with an adhesive of resin. Then, as shown in FIG. 2G, epoxy resin is injected, for forming under-fill resin 15, into the space between the electronic component 13 and the outermost layer substrate 11A. The coefficient of linear thermal expansion of the under-fill resin 15 is an intermediate value between those of the electronic component 13 and the outermost layer substrate 11A, whereby the repeated stress caused by the heat cycle is effectively decreased.

Figure 2H:
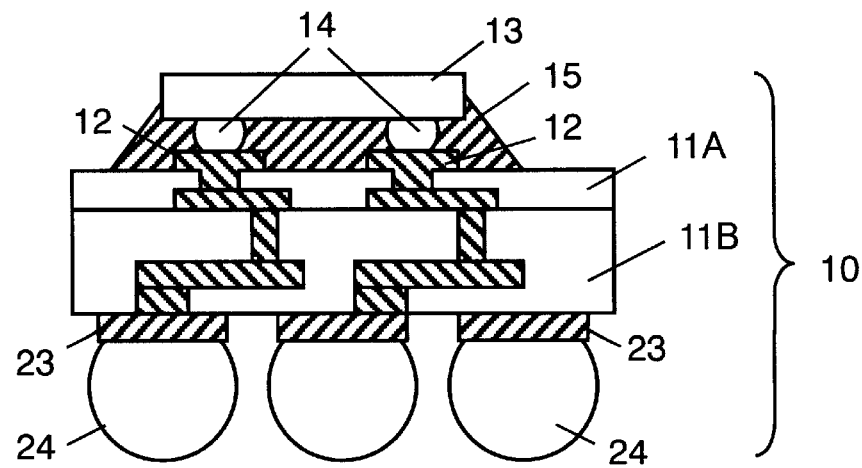

After that, as shown in FIG. 2H, bumps 24 are formed at the bottom electrodes 23 of the lower layer substrate 11B. With the bumps 24, the mounting structure 10 of the electronic component is further mounted on other substrates or the like.

In the present invention, on a lower layer substrate forming a multi-layer substrate on which an electronic component having bumps is mounted, an outermost layer substrate made of a material having larger coefficient of linear thermal expansion than that of under-fill resin is formed, and electrodes formed on the outermost layer substrate are bonded with the bumps of the electronic component, then the coefficient of linear thermal expansion of the under-fill resin is set at an intermediate value between those of the electronic component and the outermost layer substrate, accordingly the stress, caused by the heat cycle at the bonded portions of the bumps of the electronic component and the electrodes of the outermost layer substrate, is effectively decreased, whereby the break of the bonded portions is prevented and the reliability of the mounting structure is improved.

Second Exemplary Embodiment

In the following, an explanation on a mounting structure of an electronic component having bumps in a second exemplary embodiment is described referring to illustrations.

Figure 3:
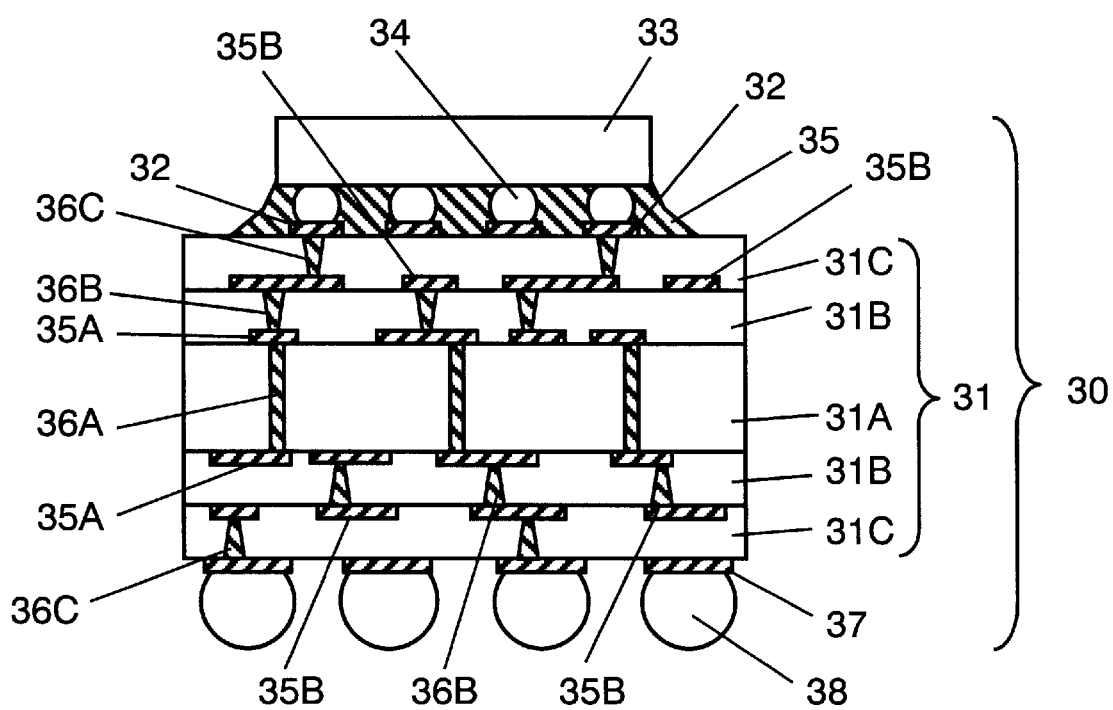
FIG. 3 is a cross sectional view showing the mounting structure of an electronic component having bumps, in a second exemplary embodiment of the present invention.

As shown in FIG. 3, a multi-layer substrate 31 comprises a first layer 31A, second layers 31B and third layers (outermost layers) 31C. The second layers 31B and the third layers 31C are disposed at both upper and lower sides of the first layer 31A. On the top of the third layer 31C of the upper side, electrodes 32 for bonding with bumps 34 of electronic component 33 are formed. Under-fill resin 35 is for sealing the bonded portions of the electrodes 32 and the bumps 34, and for decreasing stress, caused by heat-cycles, at the bonded portions of the electrodes 32 and the bumps 34.

The following is an explanation on the structure of the multi-layer substrate 31. The first layer 31A is an intermediate layer, whose material is made by a method that after impregnating glass fiber with epoxy resin, the epoxy resin is cured. At the top and the bottom of the first substrate 31A, circuit patterns 35A are formed with electrically conductive metal. The circuit patterns 35A of the top and the bottom are connected by electric conductors 36A formed in through-holes. The second layers 31B are formed with epoxy resin. At the top of the upper side and at the bottom of the lower side of the second layers 31B, circuit patterns 35B are respectively formed. The circuit patterns 35B of both sides are respectively connected with the circuit patterns 35A of both sides by electric conductors 36B formed in via-holes. The third layers 31C are the outermost layers of the multi-layer substrate 31, and are formed with the same epoxy resin as for the second layers 31B. Electrodes 32 formed on the top of the third layer 31C of the upper side and electrodes 37 formed at the bottom of the third layers 31C of the lower side are respectively connected with the circuit patterns 35B of respective sides by electric conductors 36C in the via-holes formed through the third layer 31C. The electrodes 37 formed at the bottom of the third layer 31C which is the outermost layer of the lower side are for bonding with bumps 38 formed at the electrodes 37. The electrode 32 formed on the top of the third layer 31C which is the outermost layer of the upper side are for bonding with the bumps 34 of the electronic component 33.

The following is an explanation on the coefficients of linear thermal expansion, by heat, of the materials of portions forming the above-described mounting structure of the electronic component having bumps. The coefficients of linear thermal expansion of the electronic component 33 having bumps, the under-fill resin 35, the third layer 31C and the first layer 31A are tabulated in Table 2.

For the first layer 31A, material having smaller coefficient of linear thermal expansion than that of under-fill resin is used in general. However, as in this exemplary embodiment, by using resin having larger coefficient of linear thermal expansion than that of under-fill resin 35 for the outermost layer (third layer) 31C, the coefficient of the under-fill resin 35 becomes an intermediate value between those of the electronic component 33 and the third layer 31C. Namely, the bonded portions of the bumps 34 and the electrodes 32 are sealed by under-fill resin 35 having the intermediate coefficient of linear thermal expansion between those of the electronic component 33 and the third layer 31C. Accordingly, stress caused by heat cycle at the bonded portions of the bumps 34 and the electrodes 32 is effectively decreased by the existence of the under-fill resin and the outermost layer 31C, whereby the break of the bounded portions caused by the stress is prevented.

TABLE 2

| Portion | Material | α(/k) |
| --- | --- | --- |
| Electronic component 33 having bumps | Silicon single crystal | 3 × 10⁻⁶ |
| Under-fill resin 35 | Epoxy resin (Silica filler: 50 wt. %) | 30 × 10⁻⁶ |
| Outermost layer 31C | Epoxy resin (Silica filler: 0–5 wt. %) | 60 × 10⁻⁶ |
| Intermediate layer 31A | Fiber-glass reinforced epoxy resin | 18 × 10⁻⁶ |

The following is an explanation on a mounting method of the electronic component having bumps in the second exemplary embodiment of the present invention, in which FIG. 4A through FIG. 4G are referred to.

Figure 4A:
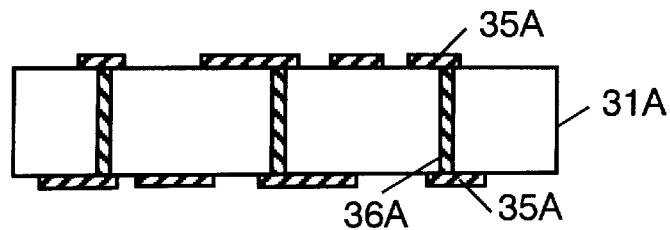
FIG. 4A through FIG. 4G are a cross sectional process views showing the mounting method of the electronic component having bumps, in the second exemplary embodiment of the present invention.

Firstly, as shown in FIG. 4A, the first layer 31A, which is the core substrate of the multi-layer substrates, is prepared.

At the top and the bottom of the first layer 31A, the circuit patterns 35A are formed. Both circuit patterns 35A are connected by the electric conductors 36A formed in the through-holes.

Figure 4B:
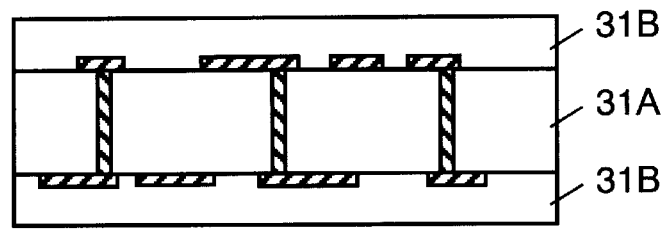

Then, as shown in FIG. 4B, at the top and the bottom of the first layer 31A, the second layers 31B are formed with epoxy resin whose coefficient of linear thermal expansion is larger than those of the first layer 31A and the under-fill resin 35.

Figure 4C:
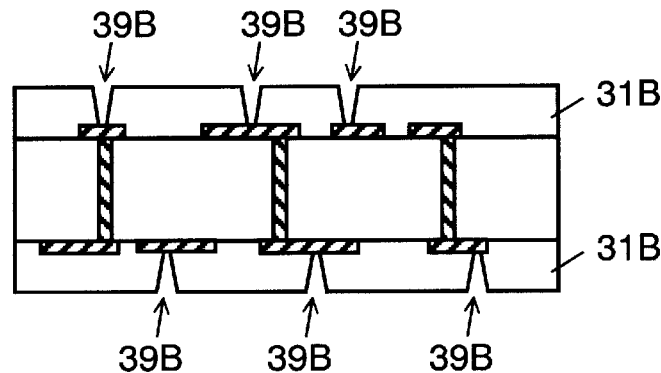

Then, as shown in FIG. 4C, the via-holes 39B are formed through the second layers 31B.

Figure 4D:
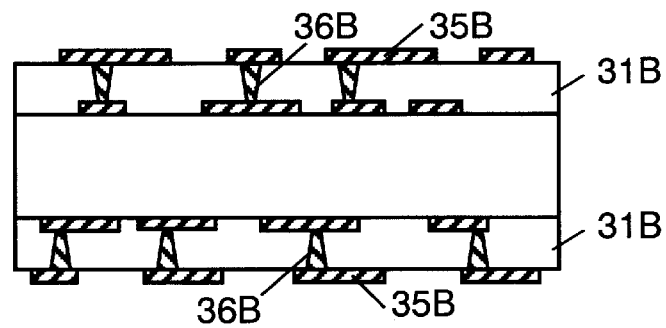

After that, as shown in FIG. 4D, the electric conductors 36B are formed in the via-holes 39B. Then, the circuit patterns 35B are formed at the top of the second layer 31B of the upper side and at the bottom of the second layer 31B of the lower side. When the circuit patterns 35B are formed by metal plating, the electric conductors 36B are formed in the via-holes 39B at the same time.

Figure 4E:
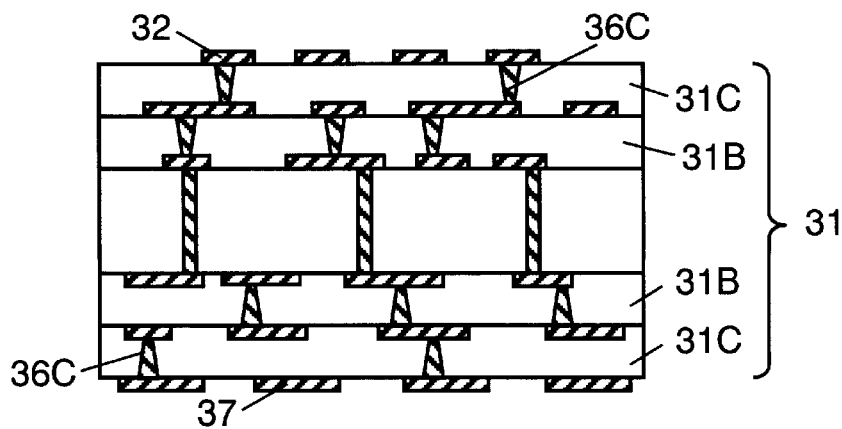

Then, as shown in FIG. 4E, the third layers 31C are formed by the same method as forming the second layers 31B. For the third layers 31C, the same epoxy resin as for the second layers 31B is used in this exemplary embodiment.

With the method as described above, the multi-layer substrate 31 is formed.

Figure 4F:
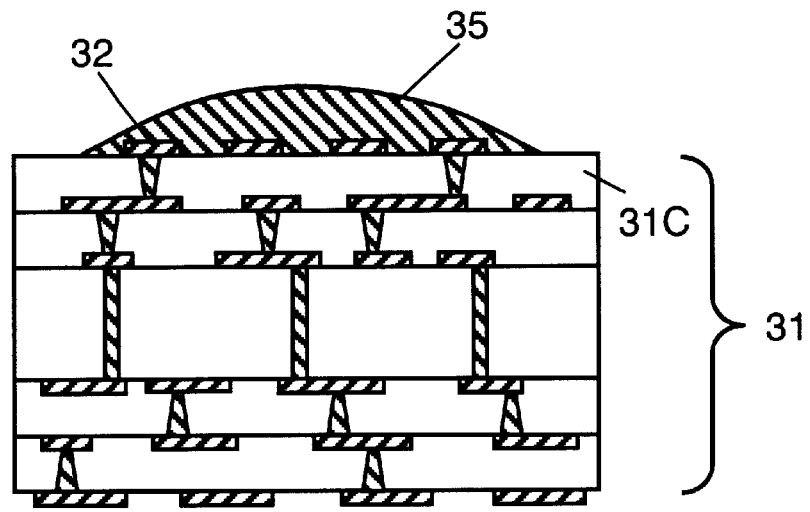

Then, as shown in FIG. 4F, on the multi-layer substrate 31, epoxy resin for forming the under-fill resin 35 is applied in the manner that the electrodes 32 are covered.

Figure 4G:
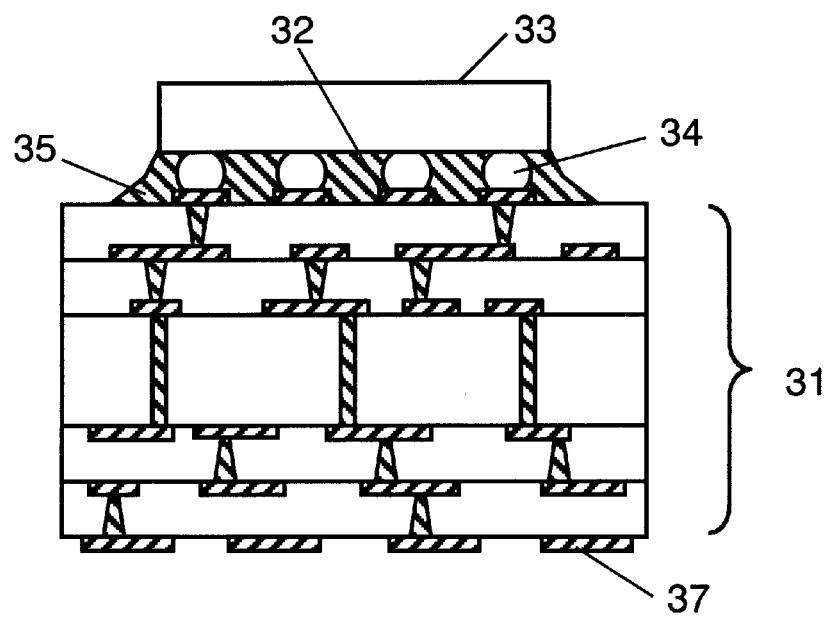
Figure 5:
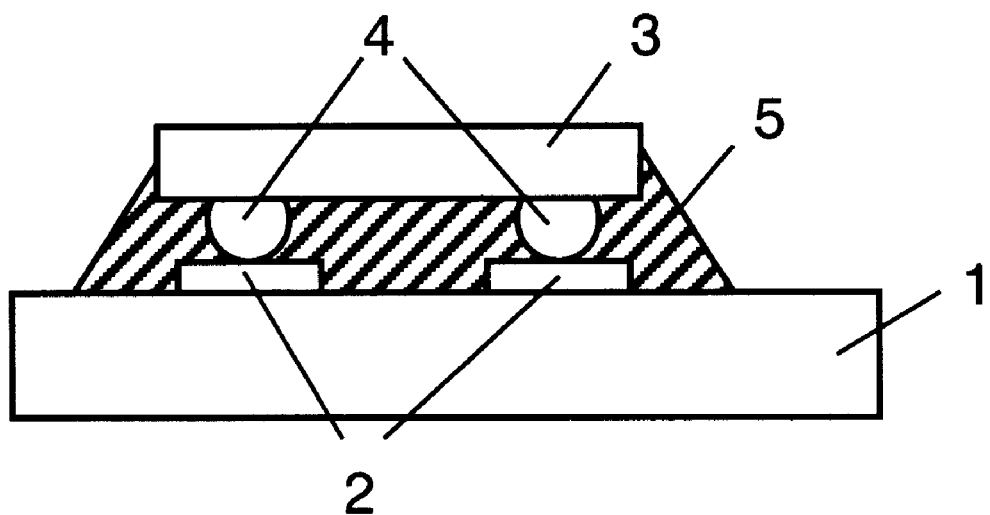
FIG. 5 is a cross sectional view showing the conventional mounting structure of an electronic component having bumps.

Then, as shown in FIG. 4G, the bumps 34 of the electronic component 33 are bonded with the electrodes 32. Then, the under-fill resin 35 is cured by heat.

The under-fill resin 35 can be formed, as in the first exemplary embodiment, by injecting epoxy resin into the space between the electronic component 33 and the multi-layer substrate 31 after the bumps 34 of the electronic component 33 and the electrodes 32 are bonded by soldering or by sticking with an adhesive.

Lastly, as shown in FIG. 3, bumps 38 are formed at the electrodes 37.

In the present invention, as described above, the stress caused by heat cycle at the bonded portions of the bumps of an electronic component and electrodes of a substrate is decreased, accordingly the break of the bonded portions is prevented, whereby the reliability of the mounting structure is improved.

What is claimed is:

1. A mounting structure of an electronic component having bumps, said mounting structure comprising:

a multi-layer substrate provided with (i) a lower layer substrate comprising at least one layer substrate and (ii) an outermost layer substrate having with coefficient of linear thermal expansion larger than coefficient of linear thermal expansion of said lower layer substrate joining the top of said lower layer substrate;

electrodes on top of said outermost layer substrate of said multi-layer substrate;

an electronic component having bumps, wherein said bumps of said electronic component are bonded with said electrodes; and under-fill resin formed between said electronic component and said outermost layer substrate, wherein the coefficient of linear thermal expansion of said under-fill resin is larger than the coefficient of linear thermal expansion of said electronic component and the coefficient of linear thermal expansion of said lower layer substrate, and smaller than the coefficient of linear thermal expansion of said outermost layer substrate.

2. The mounting structure of an electronic component having bumps according to claim 1, wherein said multi-layer substrate comprises at least three layers including an intermediate layer substrate, wherein said outermost layer is formed with resin whose coefficient of linear thermal expansion is larger than the coefficient of linear thermal expansion of said intermediate layer substrate.

3. The mounting structure of an electronic component having bumps according to claim 2, wherein said multi-layer substrate has bumps at the side opposite to the side where said electronic component is disposed.

4. A mounting structure of an electronic component having bumps according to claim 3, wherein said outermost layer substrate is formed with epoxy resin containing 0–5 wt. % silica filler, and said under-fill resin is formed with epoxy resin containing more percentage silica filler than the silica filler contained in said intermediate layer substrate, and said outermost layer substrate is formed with fiber-glass reinforced epoxy resin.

5. The mounting structure of an electronic component having bumps according to claim 2, wherein said outermost layer substrate is formed with epoxy resin containing 0–5 wt. % silica filler, and said under-fill resin is formed with epoxy resin containing more percentage silica filler than the silica filler contained in said outermost layer substrate.

6. The mounting structure of an electronic component having bumps according to claim 1, wherein said multi-layer substrate has bumps at the side opposite to the side where said electronic component is disposed.

7. The mounting structure of an electronic component having bumps according to claim 1, wherein said outermost layer substrate is formed with epoxy resin containing 0–5 wt. % silica filler, and said under-fill resin is formed with epoxy resin containing more percentage silica filler than the silica filler contained in said outermost layer substrate.

* * * * *